United States Patent
Klapper et al.

(10) Patent No.: US 10,247,782 B2
(45) Date of Patent: Apr. 2, 2019

(54) METHOD AND SYSTEM FOR TESTING A SWITCHING INSTALLATION FOR POWER TRANSMISSION INSTALLATIONS

(71) Applicant: OMICRON ELECTRONICS GMBH, Klaus (AT)

(72) Inventors: Ulrich Klapper, Rankweil (AT); Thomas Renaudin, Sailly (FR)

(73) Assignee: OMICRON ELECTRONICS GMBH, Klaus (AT)

( * ) Notice: Subject to any disclaimer, the term of this patent is extended or adjusted under 35 U.S.C. 154(b) by 205 days.

(21) Appl. No.: 15/311,785

(22) PCT Filed: May 13, 2015

(86) PCT No.: PCT/EP2015/060654
§ 371 (c)(1),
(2) Date: Nov. 16, 2016

(87) PCT Pub. No.: WO2015/173330
PCT Pub. Date: Nov. 19, 2015

(65) Prior Publication Data
US 2017/0082690 A1    Mar. 23, 2017

(30) Foreign Application Priority Data

May 16, 2014   (AT) .............................. A 50347/2014

(51) Int. Cl.
*G01R 31/327* (2006.01)
*H02B 13/065* (2006.01)
(Continued)

(52) U.S. Cl.
CPC ........... *G01R 31/3274* (2013.01); *H02B 1/26* (2013.01); *H02B 13/065* (2013.01); *H05K 5/067* (2013.01);
(Continued)

(58) Field of Classification Search
CPC ............ G01R 33/3621; G01R 33/5616; G01R 33/3642; G01R 33/3692
(Continued)

(56) References Cited

U.S. PATENT DOCUMENTS

| 7,405,569 B2 | 7/2008 | Hagel et al. | |
| 2006/0217906 A1* | 9/2006 | Barbara | G01R 1/36 |
| | | | 702/60 |

(Continued)

FOREIGN PATENT DOCUMENTS

| CH | 668 669 A5 | 1/1989 |
| DE | 20 55 477 A1 | 5/1972 |

(Continued)

OTHER PUBLICATIONS

Search Report issued in Russian Application No. 2016144729128 dated Jan. 26, 2018.
(Continued)

*Primary Examiner* — Giovanni Astacio-Oquendo
(74) *Attorney, Agent, or Firm* — Mintz Levin Cohn Ferris Glovsky and Popeo, P.C.; Peter F. Corless; Steven M. Jensen (57) ABSTRACT

A method and a system (9) for testing a switching installation (30) for power transmission installations are provided. The switching installation (30) comprises a switch (2) which either connects a first side (6) of the switch (2) to a second side (7) of the switch (2) or disconnects it therefrom, and comprises two earthing switches (10, 11). Each of the two earthing switches (10, 11) is provided to either connect the first side (6) or the second side (7) to earth (1) or to disconnect it from earth (1). To test the switching installation (30), a current is generated through the switch (2) and a magnitude of the current through the switch (2) is determined. In this respect, the two earthing switches (10, 11) are
(Continued)

closed while the current is generated and while the magnitude of the current is determined.

17 Claims, 5 Drawing Sheets

(51) Int. Cl.
    *H02B 1/26*     (2006.01)
    *H05K 5/06*     (2006.01)
    *H01H 33/02*     (2006.01)

(52) U.S. Cl.
    CPC ....... *G01R 31/3272* (2013.01); *H01H 33/027* (2013.01)

(58) Field of Classification Search
    USPC .......................................... 324/300, 318, 322
    See application file for complete search history.

(56) References Cited

U.S. PATENT DOCUMENTS

| | | | | |
|---|---|---|---|---|
| 2010/0281854 | A1* | 11/2010 | Huang | F02D 41/1495 60/276 |
| 2012/0182023 | A1* | 7/2012 | Zhang | G01M 11/3109 324/501 |
| 2014/0347068 | A1* | 11/2014 | Zhou | G06F 11/07 324/539 |
| 2015/0061725 | A1* | 3/2015 | Lee | G01R 31/31851 324/762.02 |
| 2015/0168452 | A1* | 6/2015 | Chang | G01R 31/2889 324/754.03 |

FOREIGN PATENT DOCUMENTS

| | | |
|---|---|---|
| DE | 196 48 643 A1 | 5/1998 |
| DE | 103 51 387 A1 | 6/2005 |
| DE | 20 2007 018709 U1 | 3/2009 |
| EP | 1 793 235 A1 | 6/2007 |
| RU | 2306574 C1 | 9/2007 |
| SU | 1233651 A1 | 11/1986 |
| SU | 1471156 A1 | 4/1989 |
| SU | 1684735 A1 | 10/1991 |

OTHER PUBLICATIONS

International Search Report dated Jul. 17, 2015 issued in PCT/EP2015/060654.

* cited by examiner

METHOD AND SYSTEM FOR TESTING A SWITCHING INSTALLATION FOR POWER TRANSMISSION INSTALLATIONS

This application is a National Phase application filed under 35 U.S.C. § 371 of PCT International Application No. PCT/EP2015/060654, filed May 13, 2015, which claims under 35 U.S.C. § 119(a) the benefit of Austrian Application No. A 50347/2014, filed May 16, 2014, the entire contents of which are incorporated herein by reference.

The present invention relates to a method and to a system for testing a switching installation for power transmission installations or power transmission networks.

Electric switches, particularly load switches or power switches are used in electric gas-insulated switching installations, as are used in particular for power transmission installations. In this respect, a "load switch" or a "power switch" is understood as meaning a specific switch which is configured for high currents (>1 kA). A power switch can not only switch operating currents and low overload currents, but in the event of faults, it can also reliably disconnect high overload currents and short-circuit currents (up to 800 kA). Load switches or power switches can be configured in a single-pole or three-pole form. In tests of these switching installations, particularly of the switches of these switching installations, which tests have to be carried out at regular intervals, different tests or measurements, for example a switching time measurement or a resistance measurement are carried out.

Since in the case of a gas-insulated switching installation, the actual conductors or terminals are generally inaccessible, according to the prior art the electrical connection to the switch to be checked is established via so-called earthing switches. An earthing switch usually connects the conductor or the terminal of the switch during testing to ground or earth, for example to the earthed outer wall of the switching installation in order to divert dangerous currents or voltages. However, manipulation of the earthing switches, which is necessary according to the prior art, to test the switching installation is disadvantageous for safety reasons.

Therefore, the object of the present invention is to provide a test of a switching installation for power transmission installations without manipulating the earthing switches.

This object is achieved according to the invention by a method for testing a switching installation for power transmission installations according to claim 1, by a system for testing a switching installation for power transmission installations according to claim 15 and by a switching installation for power transmission installations according to claim 19. The dependent claims define preferred and advantageous embodiments of the present invention.

Within the scope of the present invention, a method is provided for testing a switching installation (in particular a gas-insulated switching installation) for power transmission installations or power transmission networks. In this respect, the switching installation comprises a switch (in particular a load switch or power switch) which either connects a first side or a first terminal of the switch to a second side or to a second terminal of the switch, or disconnects it therefrom, subject to the position of the switch, and comprises two earthing switches. In this respect, each of the two earthing switches is configured to either connect one of the two terminals (one of the two sides) to ground or earth, subject to the state of the earthing switch or to disconnect it from ground or earth. The method according to the invention comprises the following steps:

generating a current through the switch.

determining a magnitude of the current through the switch.

While so doing, the two earthing switches are constantly closed and are not opened during the test, i.e. during the generation and determination steps.

Since the testing method according to the invention does not have to change, i.e. open, even one of the two earthing switches in order to generate the current through the switch or to determine the magnitude of the current through the switch, any manipulation of the two earthing switches for testing the switching installation is advantageously avoided. Therefore, the testing according to the invention of the switching installation can advantageously be carried out in a safer manner than is possible according to the prior art.

The testing method according to the invention can comprise a switching time measurement, i.e. a measurement of switching times of the switch, and/or a determination of the electrical resistance of the closed switch, which is also known as a microohm measurement. In the switching time measurement, disconnection and connection commands are delivered to the switch via electrical signals. The time intervals which the switch requires for opening or closing, starting from the transmission time of the respective electrical signal, are then measured on the basis of the determined magnitude of the current through the switch. Subject to these time intervals, it is then possible to assess whether the switch or the switching installation is in an adequately good condition, or whether the switching installation requires maintenance or is even defective. In other words, the test according to the invention can check the time behaviour of the switch while opening and closing in a particularly safe and reliable manner. The electrical resistance can be determined using a measurement of the voltage present via the switch in the form of a four-wire measurement, in which the terminals of the voltmeter are directly connected to the earthing switches.

There are two options for determining the magnitude of the current through the switch.

In the first option, a current is generated which flows from the first terminal of the switch to the second terminal of the switch. Since both earthing switches are closed, this current is divided, with the switch closed, into one current through the switch and one current via the earth connection. Since the current which discharges via ground or earth of the switching installation is measured, when the total current is known, the magnitude of the current through the switch can be determined in an effectively indirect manner by determining in particular the difference of the total current and the current discharging via earth.

In other words, the generation of the current through the switch according to the first option comprises, for example, connecting a device for generating the current through the switch to a branching point, at which one end of one of the earthing switches and the earth of the switching installation is connected. The determination of the magnitude of the current can then comprise measuring a further current which flows between the branching point and the earth. When the total current is known, the magnitude of the current through the switch can then be determined on the basis of the measured further current.

In the second option, the current flowing through the switch is measured directly, so that a calculation is not required to determine the magnitude of the current flowing through the switch.

In the second option as well, the generation of the current through the switch can comprise connecting the device for generating the current through the switch to the branching point, at which one end of one of the earthing switches and the earth of the switching installation is connected. The determination of the magnitude of the current through the switch can also comprise measuring a further current which, however, in the second option, flows between the branching point and the earth of the earthing switch and thereby (when the switch is closed) flows via the switch. Thus, this further current corresponds to the current through the switch (when this is closed), so that the measured magnitude of the further current corresponds to the magnitude of the current through the switch.

In both options, the current through the switch can be determined at any time.

The current through the switch can either be generated using a current source or using a voltage source.

When the current though the switch is generated using a voltage source, the voltage source is in particular connected parallel to the switch.

The current through the switch can be generated as direct current, as alternating current or as a mixture which comprises both a direct current and an alternating current. Furthermore, the current through the switch can rise and/or fall in a transient manner, i.e. rapidly (for example abruptly).

In order to measure the (further) current, a current transformer having a split core can advantageously be used which is attached around the appropriate line in which the current is to be measured. As a result, the current transformer can advantageously be subsequently connected in the switching installation, without for example the earthing switches having to be manipulated for this purpose. In this respect, a "current transformer" is understood as meaning a type of measuring transducer which is constructed or which operates as a type of transformer.

Furthermore, a split ferrite can advantageously be attached to increase the inductance of a current path to earth or ground of the switching installation, as a result of which a greater proportion of the generated current then flows through the (closed) switch. The split ferrite or ferromagnetic material can be arranged around a connection from one earthing switch to earth or around both connections from the respective earthing switch to earth.

Like the split core of the current transformer, the split ferrite is a split ferrite core which can be subsequently fitted around a line inside the switching installation. The effect of the ferromagnetic material increases as the frequency of the generated current increases, so that the higher the frequency of the generated alternating current, the greater the proportion of generated current which is forced through the (closed) switch.

If the generated current through the switch is a direct current, to determine the magnitude of the current through the switch, a measuring device can be used which operates according to the Néel effect. In this respect, the direct current to be measured is measured using a voltage which is induced by the direct current, the magnitude of the current through the switch then being determined on the basis of the measured voltage.

To achieve the Néel effect, a superparamagnetic material is arranged in a coil. Due to the non-linearity of the superparamagnetic material, the voltage dropping via the coil comprises a plurality of frequency components. The magnitude of a direct current can then also be detected using a frequency shift of these frequency components. A direct current can also be measured using a Hall probe.

Since in this embodiment, the current through the switch can be determined or measured directly using the Néel effect, the electrical resistance of the closed switch can advantageously also be calculated or determined if the direct voltage, dropping via the switch, is also known or is measured.

Based on the determination of the magnitude of the current through the (closed) switch, times of an abrupt change in the flow of current through the switch can also be detected, in order to determine, on the basis thereof, the times at which the switch is switched on and/or is switched off.

By determining the corresponding switching times of the switch, i.e. by determining the times at which the switch is switched on and/or off, it is advantageously possible for the previously mentioned switching time measurement to be realised.

According to a preferred embodiment according to the invention, the switching installation comprises a plurality of switches, each of these switches either connecting or disconnecting two terminals of the respective switch. A switching installation of this type is configured to switch a multi-phase (for example a three-phase) current. In this respect, associated with each terminal of a switch is a respective earthing switch, by which the respective terminal is usually connected to earth or ground during testing, and can be disconnected from earth during normal operation of the switching installation. The magnitude of the current through the respective switch can either be measured directly or can be determined using a measurement of currents, which are discharging into the earth of the switching installation, when the total current is known which is formed from the sum of the currents through the switches and the currents discharging into the earth.

This embodiment allows, inter alia, the determination of the respective times at which the respective switch is opened and/or closed, and the determination of the electrical resistance of the respective closed switch. In this respect, the currents can be measured or determined at the same time or one after another and at any time.

Within the scope of the present invention, a system is also provided for testing a switching installation for power transmission installations. As in the case of the method according to the invention, the switching installation comprises a switch which either connects a first side of the switch to a second side of the switch or disconnects it therefrom, and comprises two earthing switches. The system comprises a first device to generate a current, and a second device to measure a measurable variable (for example a current or a voltage) of the switching installation, and comprises control means. The system is configured to generate a current through the switch by means of the first device, when the earthing switches are constantly closed, and to determine a magnitude of the current through the switch with the aid of the control means, starting from the measured variable which was detected by means of the second device, without thereby one of the two earthing switches being opened.

The advantages of the system according to the invention substantially correspond to the advantages of the method according to the invention, which have been described above in detail, so that it is unnecessary to repeat them here.

According to a preferred embodiment of the invention, the second device comprises an ammeter with a Rogowski coil.

In principle, a Rogowski coil is only configured to measure alternating currents. However, using the Rogowski coil, it is also possible to detect changes in current flows, as occur for example when the switch is opened and/or closed. A voltage drops via the Rogowski coil, which voltage substantially corresponds to the first derivation of a current flowing through the Rogowski coil.

Therefore, the system according to the invention is configured in particular to detect current peaks which occur when the switch is connected or disconnected when the current flows through the switch, using the Rogowski coil.

Thus, by means of the Rogowski coil, voltage peaks are generated, using which the time of the opening and/or closing of the switch can be determined relatively accurately, as a result of which the previously mentioned switching time measurement can be realised. In this respect, when the switch is closed, the voltage peaks occur in a particular direction (i.e. with a particular polarity) and when the switch is opened, they occur is the opposite direction (i.e. with an opposite polarity), which can be used to decide when the switch is connected or disconnected.

Finally, within the scope of the present invention, a switching installation for power transmission installations or power transmission networks is provided. In this respect, the switching installation according to the invention comprises at least one switch which either connects a first side of the switch to a second side of the switch or disconnects it therefrom, and comprises at least two of the previously mentioned earthing switches. Furthermore, the switching installation comprises a previously described system according to the invention.

The present invention can be used in particular for testing switching installations for power transmission installations. Of course, the present invention is not restricted to this preferred field of application, since the present invention can also be used, for example for other switching installations which are used outside a power transmission installation.

In the following, the present invention will be described in detail on the basis of embodiments according to the invention with reference to the figures.

Figure 1:
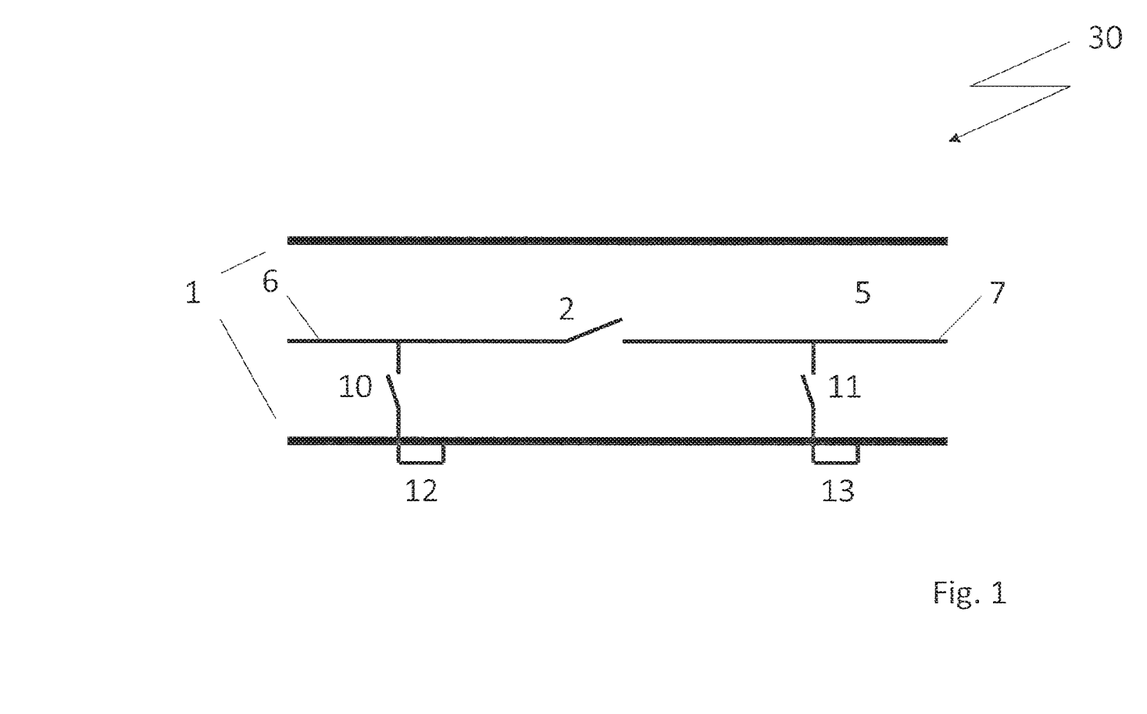
FIG. 1 schematically shows a gas-insulated switching installation.

FIG. 1 schematically shows a gas-insulated switching installation 30 which comprises a gas pipe 1 in which a load switch or power switch 2 of the switching installation 30 is arranged. The gas pipe 1 is preferably filled with SF6 gas 5 which is under high pressure in order to achieve a high insulation capacity even in the case of relatively small dimensions. A respective earthing switch 10, 11 of the switching installation 30 is connected to a terminal 6, 7 of the switch 2 in order to earth the respective terminal 6, 7 while the switching installation 30 is being tested. For this purpose, the earthing switches 10, 11 are often connected in a releasable manner to the gas pipe 1 of the switching installation 30 by a screw connection 12, 13 and are thereby connected to earth or ground.

Figure 2:
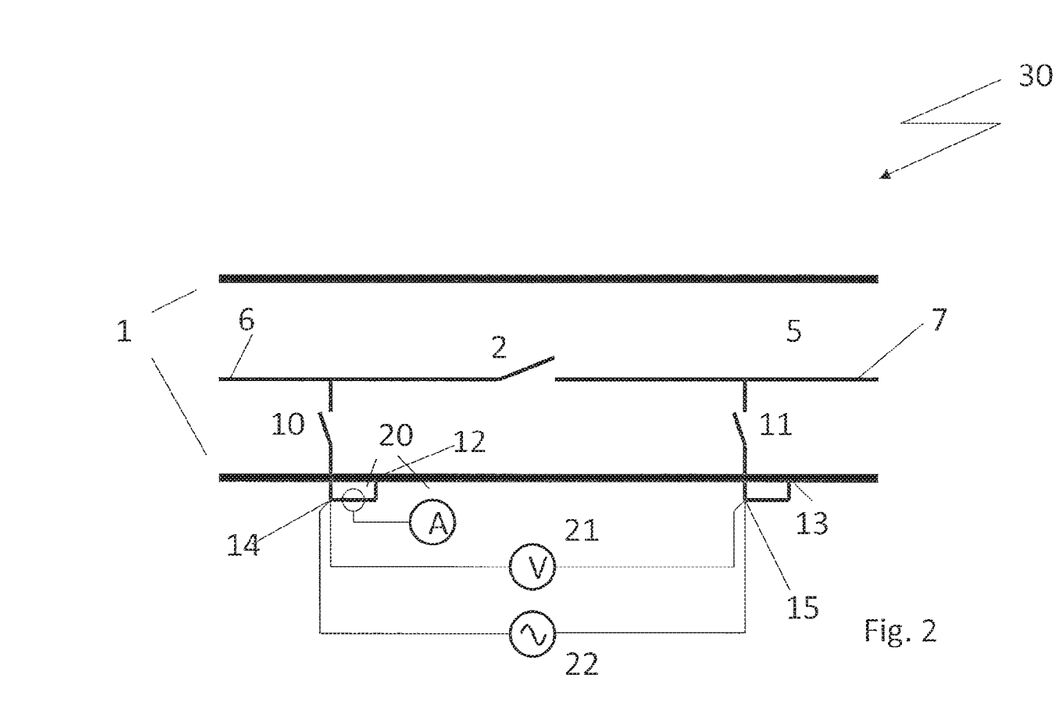
FIG. 2 schematically shows the testing according to the invention of a gas-insulated switching installation with a current generating device and an ammeter.

FIG. 2 schematically shows how a test according to the invention of the switching installation 30, shown in FIG. 1, is realised.

For this purpose, a signal or a current is fed to a branching point 14 by means of a current source 22. When the earthing switches 10, 11 and switch 2 are closed, the current which has been fed in from the current source 22 flows partly from the branching point 14 via the earthing switch 10 and the switch 2 and the earthing switch 11 to the second branching point 15, and it flows partly from the branching point 14 via the ammeter 20 to the ground 1 and from there, it also flows to the second branching point 15. If the total current, generated by the current source 22 is known, the current which flows through the switch 2 can be determined using the current which is measured by the ammeter 20, by forming the difference of the total current minus the measured current.

Furthermore, the voltage generated between the branching points 14, 15 can optionally be measured using a voltmeter 21 by means of a four-wire measurement (i.e. the voltmeter 21 is directly connected to the branching points 14, 15). When the current through the switch 2 and the voltage falling via the switch 2 are known, it is possible to determine the electrical resistance of the switch including the two earthing switches.

Figure 3:
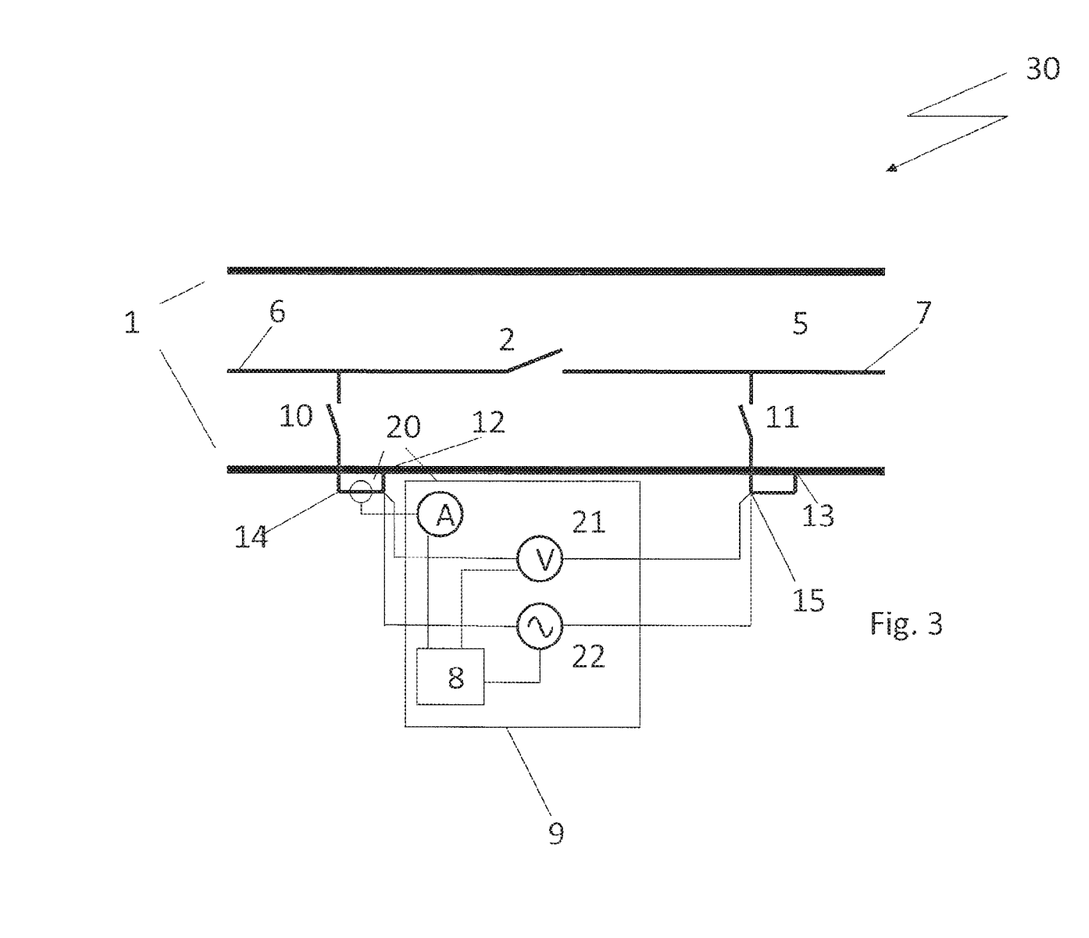
FIG. 3 schematically shows a switching installation according to the invention which comprises a system according to the invention.

FIG. 3 shows a further embodiment according to the invention for testing the switching installation 30, shown in FIG. 1.

In contrast to the embodiment shown in FIG. 2, in the embodiment shown in FIG. 3, the current which flows from the branching point 14 via the earthing switch 10 to the switch 2 is measured. In other words, in the embodiment shown in FIG. 3, the current through the (closed) switch 2 is measured directly, whereas it is measured indirectly in the embodiment shown in FIG. 2 and is then calculated or determined by a calculation, subject to the total current.

Furthermore, FIG. 3 schematically shows a system 9 according to the invention for testing the switching installation 30. In addition to the current source 22 and to the ammeter 20, the system 9 according to the invention comprises a control means 8 to coordinate and control the testing of the switching installation 30.

As in the embodiment shown in FIG. 2, in the embodiment shown in FIG. 3, the voltage generated between the branching points 14, 15 can optionally be measured using the voltmeter 21, in particular by means of a four-wire measurement, as a result of which the electrical resistance of the switch 2 can again be determined.

Figure 4:
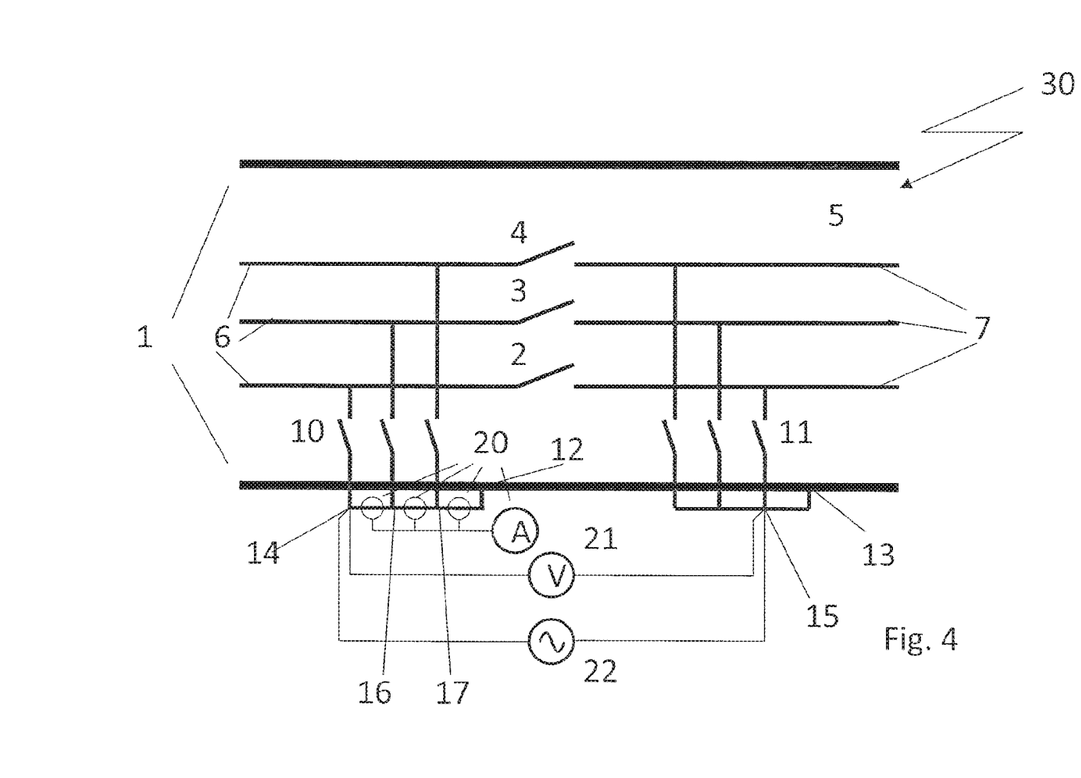
FIG. 4 schematically shows the testing according to the invention of a three-phase switching installation according to a first embodiment.

FIG. 4 shows a switching installation 30 which can switch a three-phase current. For this reason, the switching installation 30 shown in FIG. 4 comprises three switches 2, 3, 4, instead of only one switch 2. The terminal 6, 7 of each switch 2, 3, 4 is optionally connected to earth 1 via an individual earthing switch 10, 11, so that there are respectively two earthing switches 10, 11 for each switch 2, 3, 4 and thus a total of six earthing switches 10, 11 for the switching installation 30 shown in FIG. 4.

By means of at least one current source 22, a current is impressed at the branching point 14, which current either flows via one of the three series connections which respectively consist of an earthing switch 10, followed by a switch 2, 3, 4 and a further earthing switch 11, to the branching point 15, or discharges to earth 1 via the three ammeters 20. Since the current which flows from branching point 14 to branching point 16, the current which flows from branching point 16 to branching point 17 and the current which discharges to earth from branching point 17 can be measured by the ammeters 20, if the total current, generated by the current source 22 is known, it is also possible to calculate the respective current which flows through the respective (closed) switch 2, 3 or 4.

Once again, the voltage, generated between the branching points 14, 15 can optionally be measured by the voltmeter 21, in particular by means of a four-wire measurement.

Figure 5:
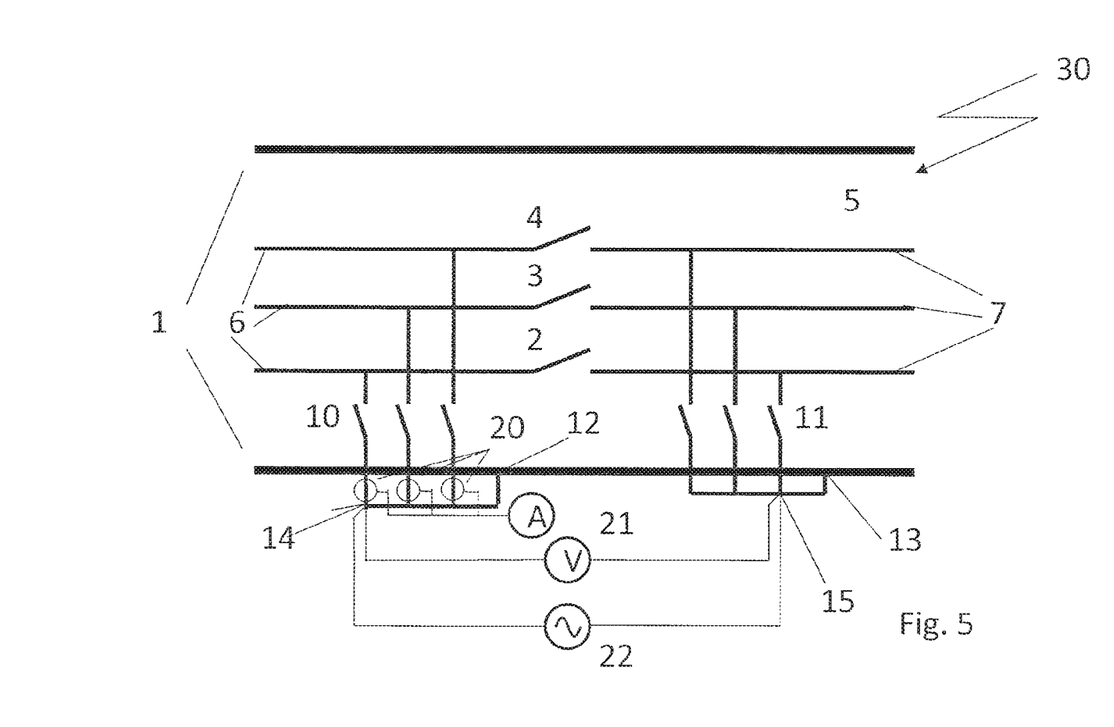
FIG. 5 schematically shows the testing according to the invention of a three-phase switching installation according to a second embodiment.

The further embodiment according to the invention shown in FIG. 5 differs in a similar manner from the embodiment shown in FIG. 4, as the embodiment shown in FIG. 3 differs from the embodiment shown in FIG. 2. In the embodiment shown in FIG. 5, the currents which respectively flow through the (closed) switch 2, 3, or 4 are measured directly by the ammeters 20. The other features of the embodiment shown in FIG. 5 correspond to the embodiment shown in FIG. 4.

The ammeters 20 shown in FIGS. 2 to 5 can be realised in particular using current transformers which comprise a split core, or using Néel effect sensors or Rogowski coils. An ammeter 20 is arranged around the respective portion of line in the place shown in FIGS. 2 to 5 in order to respectively detect the current which is flowing through the portion of line. As a result, the current flowing through the portion of line can be advantageously measured, without any of the earthing switches 10, 11 or the screw connection 12, 13 having to be manipulated (for example released) in any way, as is often the case in the prior art.

LIST OF REFERENCE NUMERALS 1 gas pipe
2 switch
3 switch
4 switch
5 gas
6, 7 terminal
8 control means
9 system
10, 11 earthing switch
12, 13 screw connection
14-17 branching point
20 measuring device
21 voltmeter
22 current source
30 switching installation

The invention claimed is:

1. Method for testing a switching installation for power transmission installations,
wherein the switching installation comprises a switch which either connects a first side of the switch to a second side of the switch or disconnects it therefrom, and comprises two earthing switches,
wherein each of the two earthing switches is provided to either connect the first side or the second side to earth or to disconnect it from earth,
wherein the method comprises:
generating a current through the switch, and
determining a magnitude of the current through the switch,
wherein the two earthing switches are closed during the generation and determination steps.

2. Method according to claim 1,
wherein the determination of the magnitude of the current through the switch comprises measuring a current discharging into the earth of the switching installation and determining a total current which is composed of the current through the switch and of the current discharging into the earth.

3. Method according to claim 1,
wherein the current through the switch is measured directly in order to determine the magnitude of the current through the switch.

4. Method according to claim 2,
wherein the current through the switch is generated by a current source or by a voltage source.

5. Method according to claim 1,
wherein the current through the switch is a direct current, an alternating current or a mixture of a direct current and an alternating current.

6. Method according to claim 1,
wherein the determination of the magnitude of the current through the switch comprises fitting a split core of a current transformer in order to measure a further current by means of the current transformer and to determine the magnitude of the current through the switch, subject to the measured further current.

7. Method according to claim 1,
wherein the magnitude of the current through the switch is determined using a Rogowski coil.

8. Method according to claim 1,
wherein the method comprises fitting a split ferrite in order to increase the inductance of a current path to the earth of the switching installation, to thereby force a greater proportion of the generated current through the switch.

9. Method according to claim 1,
wherein:
the current through the switch is a direct current, and
the determination of the magnitude of the current through the switch comprises arranging a measuring device which operates by the Néel effect, in order to measure a further current and, on the basis thereof, to determine the current through the switch.

10. Method according to claim 9,
wherein a voltage which drops via the switch is determined, and a resistance of the switch is determined on the basis of the magnitude of the current and on the voltage which drops via the switch.

11. Method according to claim 1,
wherein the determination of the magnitude of the current through the switch comprises detecting times of an abrupt change in the magnitude of the current in order to derive therefrom switching times of the switch.

12. Method according to claim 1,
wherein:
the switching installation comprises a plurality of switches which either connect a respective first side of the respective switch to a second side of the respective switch or disconnect it therefrom, and are configured to switch a multiphase current,
associated with each side is a respective earthing switch to either connect the respective side to earth or to disconnect it from earth, and
a magnitude of a current through each switch is measured directly, or the magnitude of the current through each switch is determined by measuring currents discharging into the earth of the switching installation and by determining a total current which is composed of the currents through the switches and of the currents discharging into the earth.

13. Method according to claim 1,
wherein the switching installation is a gas-insulated switching installation.

14. Method according to claim 1,
wherein the switch is a load switch or a power switch.

15. System for testing a switching installation for energy transmission installations,
wherein the switching installation comprises a switch which either connects a first side of the switch to a second side of the switch or disconnects it therefrom, and comprises two earthing switches,
wherein each of the two earthing switches is provided to either connect the first side or the second side to earth or to disconnect it from earth,
wherein the system comprises a first device for generating a current, a second device for measuring a measurable variable of the switching installation, and comprises control means,
wherein the system is configured to generate a current through the switch by means of the first device, when the earthing switches are closed, and to determine a magnitude of the current through the switch by the control means, on the basis of the measured variable which was measured by the second device, without one of the two earthing switches being opened for this purpose.

16. System according to claim 15,
wherein the second device comprises an ammeter with a Rogowski coil.

17. System according to claim 16,
wherein by means of the Rogowski coil, the system is configured to detect current peaks which occur when the switch is switched on or off.

* * * * *